US010103747B1

(12) United States Patent
Pasha.B.K. et al.

(10) Patent No.: US 10,103,747 B1
(45) Date of Patent: Oct. 16, 2018

(54) LOSSLESS BINARY COMPRESSION IN A MEMORY CONSTRAINED ENVIRONMENT

(71) Applicant: International Business Machines Corporation, Armonk, NY (US)

(72) Inventors: Shakeeb A. Pasha.B.K., Bangalore (IN); Sachin Gupta, Bangalore (IN); Sunil Kumar, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/828,782

(22) Filed: Dec. 1, 2017

(51) Int. Cl.
    *H03M 7/30* (2006.01)
(52) U.S. Cl.
    CPC ........ *H03M 7/6058* (2013.01); *H03M 7/3086* (2013.01); *H03M 7/3088* (2013.01)
(58) Field of Classification Search
    CPC ..... H03M 7/42; H03M 7/3086; H03M 7/6058
    USPC ...................................................... 341/51, 87
    See application file for complete search history.

(56) References Cited

U.S. PATENT DOCUMENTS

| 5,635,932 | A  | * | 6/1997  | Shinagawa ............. G06T 9/005 341/51 |
| 6,301,394 | B1 | * | 10/2001 | Trout ...................... H03M 7/30 341/51 |
| 6,392,567 | B2 | * | 5/2002  | Satoh .................. H03M 7/3086 341/51 |
| 8,497,788 | B1 |   | 7/2013  | Miller et al. |
| 2009/0174583 | A1 | | 7/2009 | Diaz-Gutierrez et al. |
| 2010/0077141 | A1 | | 3/2010 | Achler |
| 2010/0223237 | A1 | | 9/2010 | Mishra et al. |

OTHER PUBLICATIONS

Pasha.B.K. et al., "Lossless Binary Compression in a Memory Constrained Environment," U.S. Appl. No. 15/828,774, filed Dec. 1, 2017.
List of IBM Patents or Patent Applications Treated as Related, dated Nov. 30, 2017, 2 pages.

* cited by examiner

*Primary Examiner* — Khai M Nguyen
(74) *Attorney, Agent, or Firm* — Nolan M. Lawrence (57) ABSTRACT

A method for compressing a data structure generated for a computing system includes: generating a table comprising block values of a set of blocks in the data structure, where a block size of each block in the set of blocks is determined by an architecture of the computing system and the values are a threshold number of the most frequently occurring values; determining whether a first value of a block is stored in the table, where the block occurs; storing, in response to determining that the first value is stored in the table, a table index of the first value in a first data structure; storing, in a second data structure, a second value indicating whether the first value is stored in the table; generating a compressed data structure, where the compressed data structure comprises the table, first data structure and the second data structure.

20 Claims, 6 Drawing Sheets

LOSSLESS BINARY COMPRESSION IN A MEMORY CONSTRAINED ENVIRONMENT

BACKGROUND

The present disclosure relates to data compression, and more specifically, to lossless compression of binary executable in a memory constrained environment.

Data compression finds use in computing systems because it can reduce the amount of computing resources needed to store and transmit data. Generally, compression reduces the size of a data set by removing redundant data to encode the data set using fewer bits than the data set's original representation. Binary files are typically compressed using lossless compression techniques because these files typically contain executable code, or data where a loss of information can render the file unusable. Lossless compression can reduce the size of a file or data set without loss of information by removing statistical redundancy.

SUMMARY

According to embodiments of the present disclosure, method for compressing a data structure generated for a computing system, can include generating a table comprising block values of a set of blocks in the data structure. A block size of each block in the set of blocks is determined by an architecture of the computing system. Additionally, the block values in the table are a threshold number of the most frequently occurring block values in the data structure. The method further includes determining whether a first block value of a block in the data structure is stored in the table, where the block occurs at a position in the data structure. The method further includes storing, in response to determining that the first block value is stored in the table, a table index of the first block value at a first location in a first data structure, where the first location corresponds to the position. The method further includes storing, at a second location in a second data structure, a second value indicating whether the first block value is stored in the table, wherein the second location corresponds to the position. The method additionally includes generating a compressed data structure, where the compressed data structure comprises the table, first data structure and the second data structure.

Various embodiments are directed to method for decompressing a compressed data structure generated for a computing system. The method includes generating a first block from the compressed data structure value by: reading a first indicator from a first field of the compressed data structure; reading a first symbol from a second field of the compressed data structure; determining, using the first indicator, whether the first symbol is compressed; reading, in response to determining that the first symbol is compressed, a block value of the first block from a third field of the compressed data structure, where the block value is stored in the third field at an index indicated by the first symbol, and a block size of each block value of the third field is determined by an instruction set of the computing system. The method further includes generating an uncompressed data structure by storing the first block in an uncompressed data structure.

Other embodiments are directed to systems and computer program products for implementing the methods described herein.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to data compression, and more specifically, to lossless compression of binary executable in a memory constrained environment. While the present disclosure is not necessarily limited to such applications, various aspects of the disclosure may be appreciated through a discussion of various examples using this context.

The choice of an algorithm for binary executable compression can depend on the modalities of the algorithm's usage, such as compression/decompression environment, time related performance, and mode of delivery. Currently, a universal compression algorithm for binary executables that provide consistent performance across different computing platforms does not exist. Considering executable files (e.g., binary executables), many available lossless binary data compression algorithms do not meet the challenges of a memory constrained embedded device environment. In these environments, there are limitations on the net redundant data and the memory footprint available for compression and decompression algorithms.

Some of the challenges for compression in a memory constrained embedded devices environment are memory constraints (e.g., the compressed data, dictionary size and the decompression algorithm itself should be part of a sparsely available memory), and constraints on the efficiency of the decompression algorithm (e.g., the decompression algorithm should have a static memory footprint during execution and should emphasize performance in terms of, for example, decompression rate). Another challenge is that the data sets (e.g., data stored in a data structure) to be compressed are small. This latter challenge can make it difficult for compression algorithms in embedded devices to take advantage of benefits of having large data sets with redundancy.

Compression ratios are often used to evaluate the performance of compression algorithms. A compression ratio is typically defined as a ratio of compressed output data of a compression algorithm to the uncompressed input data. Embodiments of the present disclosure, however, a based on the recognition that the memory footprint of the decompression algorithm (e.g., the amount of memory used, or required, to execute the decompression algorithm, and the size of the algorithm) should be included in the definition of compression ratio. Accordingly, as used in the present disclosure, compression ratio is defined as a ratio of the sum of compressed output data and the size of decompression algorithm memory footprint to the uncompressed input data. Embodiments of the present disclosure address the previously mentioned challenges as well as provide compression ratios on the order 30%.

The term data object, as used in the present disclosure, refers to a unit of data storage on a computing system. A data object can be a simple unit of storage such as a bit, a byte, a word, and a string. A data object can also be a complex unit of storage such as an instantiated data structure or a class.

As used herein, a data structure can be a file, an array, a table, or other construct for storing data or a data set. Compressing a structure refers to compressing a data set stored in the data structure. Similarly, decompressing a data structure, or a compressed data structure, refers to decompressing a compressed data set stored in the data structure. Generally, operations performed on a data structure (e.g., a compressed data structure, and an uncompressed data structure) is deed to be performed on a data stored in the data structure.

As used herein, a block is a set of one or more data objects of an uncompressed data structure. The set of one or more data objects in a block can be operated on as a single unit. A symbol refers to a data object or a set of data objects in a compressed data structure. Each symbol in a compressed data structure can correspond to a block in an uncompressed data structure. A compressed symbol can have a smaller data width (e.g., represented using fewer bits or other data objects) than its corresponding block. An uncompressed data symbol can have as large a data width as its corresponding block.

According to various embodiments, a modified dictionary based compression technique (hereinafter, "compression technique") can be used to compress an input structure (e.g., a binary executable) in an embedded device environment to generate a compressed data structure. According to known dictionary based compression techniques, blocks (e.g., one or more data objects) in an input data structure can be compared to a set of preselected blocks in a dictionary (e.g., a table or other indexable data structure). When a match between an input block from an input data structure and a preselected block stored in a dictionary is found, a symbol referencing the location of the matching preselected block in the dictionary is stored in a compressed data structure as a location designated for a symbol corresponding to the input block.

The compression technique can include determining a fixed block size for operating an input data structure. The block size can be based on the architecture of the computing system for which the input data structure was configured. For example, when the input data structure is a binary executable file (hereinafter, binary executable), the block size can be the size (e.g., the data width) of the instruction set of the computing system on which the executable is configured to execute. A binary executable configured to execute on a 32-bit computing system, for example, can have a block size of 4 bytes. The block size is customizable to a given computing system, but, once selected, is fixed for the entire data structure (e.g., the entire data set stored in the data structure). A fixed block size can reduce memory usage (e.g., as compared to techniques that the variable block sizes) during decompression, thus improving compression ratios.

The compression technique further includes generating a dictionary (e.g., a table, array, or other indexable data structure) by generating a histogram of the data values (e.g., blocks) stored in the input data structure. Each unique data value in the data structure is allocated to its own bin in the histogram. The data values with the greatest frequency (e.g., the largest number of occurrences) used to generate the dictionary to be used for compression. In some embodiments, a threshold number of the most frequent data values can be used to generate the dictionary. For example, the most frequent 256 data values in the input data structure can be used to generate the dictionary. A dictionary built from a binary executable file according to this technique can generate consistent compression ratios across different software or firmware applications on a given platform.

The compression technique limits the size of the dictionary used to generate the compressed data set to ensure that a data width of indexes into the dictionary is smaller than the selected block size (e.g., the width of the instruction set of a target computing system). Additionally, the compression technique uses indexes into the dictionary as symbols in the compressed data structure. These two features of the compression technique can limit the size of compressed symbol (e.g., symbol size is limited by the number of entries in the dictionary) and reduces the costs of dictionary lookups during decompression (e.g., a key to, or index into, the dictionary does not have to be calculated or generated to perform a lookup). In some embodiments, the dictionary size is limited to 256 entries, resulting in a symbol size of one byte per symbol. Other hashing or indexing techniques, however can be used. At a minimum, a data width for the dictionary index (e.g., the symbol data width) should be smaller than the data width of the blocks stored in the dictionary.

The compression technique further includes generating a header containing compression indicator data objects (hereinafter, compression indicators) for each symbol in the compressed data structure. In some embodiments, each compression indicator is a single bit. Each compression indicator correspond to a symbol that will be stored in the compressed data structure, and indicates whether the symbol is compressed or uncompressed (e.g., raw). The number of compression indicators (e.g., the size of the header) is thus predetermined. The predetermined header size enables the size of the dictionary to be limited, avoids the storage of per symbol length and index information, and enables parallelization of the decompression technique corresponding to the compression technique.

The compression technique further includes generating the compressed data structure by reading a block from the input data structure, and determining whether the block matches a stored block in the dictionary. When the input block does match a stored block in the dictionary, an index of the match in the dictionary (e.g., a table index) is selected as compressed symbol for the input block. The compressed symbol is then stored in the compressed data structure (e.g., in a compressed data field of the compressed data structure) at a location designated for a symbol corresponding to the input block. When the input block does not match a stored block in the dictionary, the input block is set or assigned as the uncompressed symbol for the input block. The uncompressed symbol is then stored in the compressed data structure at a location designated for a symbol corresponding to the input block (e.g., the input block is stored raw or uncompressed in the compressed data structure). Additionally, a compression indicator is set in the header, at a location designated for the compression indicator of the stored symbol, to indicate whether the stored symbol was compressed or not compressed.

According to various embodiments, one or more of the header, the dictionary, and the compressed data field can be stored in distinct data structures. In these embodiments compressing an input data structure can include combining the data structures for one or more of the header, the dictionary, and the compressed data field into a single compressed data structure or file. In some embodiments, the header, the dictionary, and the compressed data field each be generated and stored in a single data structure having at least a header field, a dictionary field, and a compressed data field.

According to additional embodiments of the present disclosure, a technique for decompressing a compressed data structure generated according the compression technique described herein can include generating an uncompressed data object from the compressed data structure and storing the uncompressed data object in an uncompressed data structure. In some embodiments, an uncompressed data object can be generated by reading a compression indicator from a header field of the compressed data structure to determine symbol in the compressed data structure are compressed (e.g., stored in compressed form). A symbol corresponding to the compression indicator can then be read from the compressed data structure (e.g., a compressed data field of the compressed data structure). The symbol can then be used to index the dictionary (e.g., the dictionary field of the compressed data structure) to determine an uncompressed value of the symbol when the compression indicator indicates that the symbol is compressed. The uncompressed value can then be stored in a decompressed data structure or file as the uncompressed data object. Alternatively, the symbol can be stored in the uncompressed data structure as the value of the uncompressed data object when the compression indicator indicates that the symbol is not compressed. In some embodiments, two or more uncompressed data objects can be generated concurrently, or substantially in parallel, according to this technique.

Figure 1:
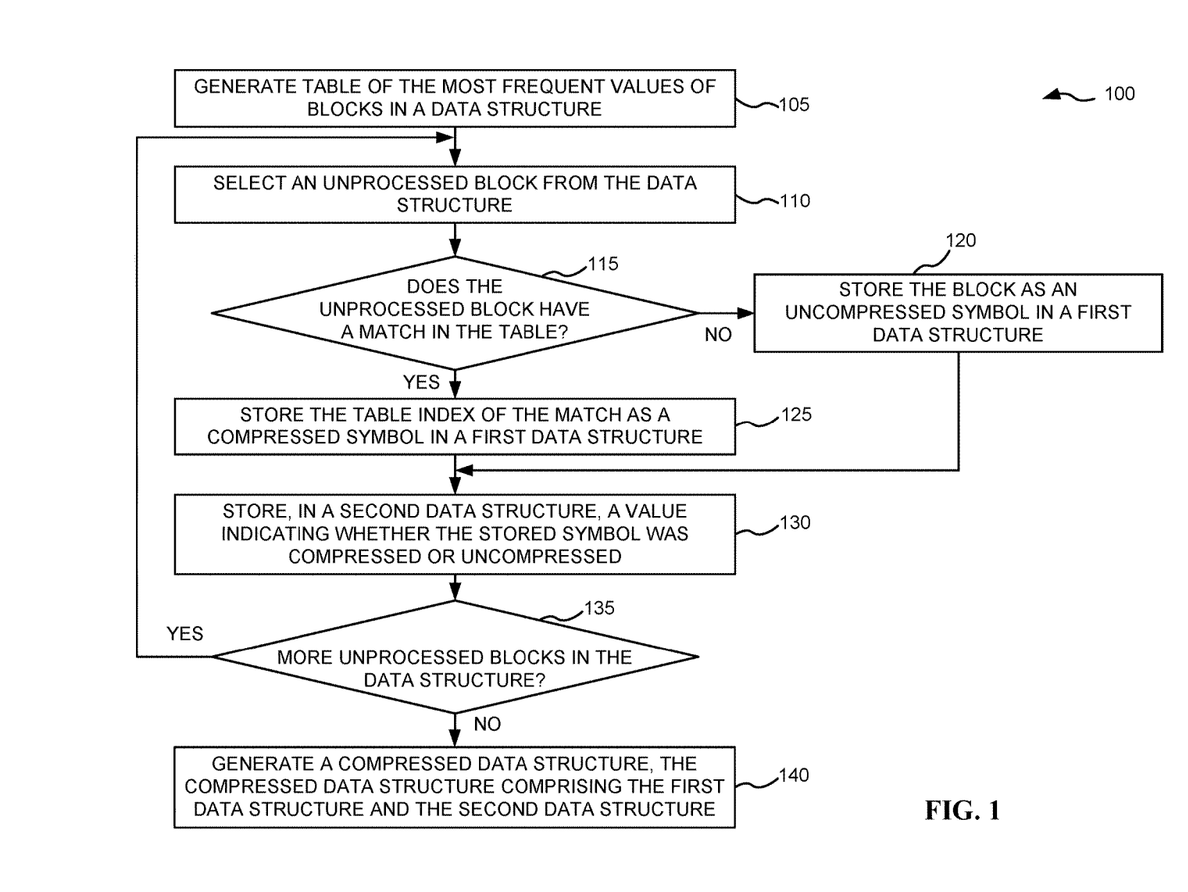
FIG. 1 depicts a flowchart of a set of operations for compressing a data structure generated for a computing system, according to various embodiments.
Figure 6:
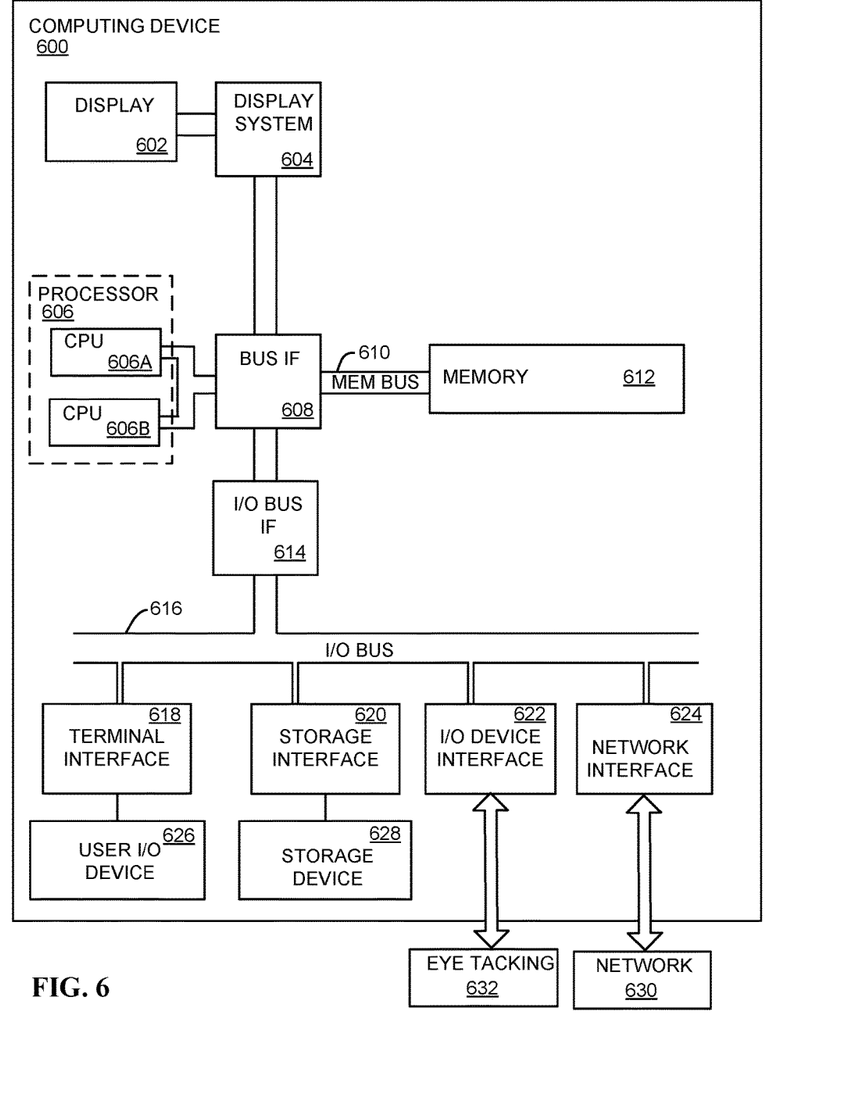
FIG. 6 depicts a block diagram of a computing system configured to execute a set of operations for compressing and decompressing a structure, according to various embodiments.

FIG. 1 depicts a flowchart of a set of operations 100 for compressing a data structure generated for a computing system, according to various embodiments. The data structure can include an input data set. In some embodiments, data structure is compressed according to the operations 100 to generate a compressed data structure having, for example, a header field, a dictionary field, and a compressed data field. In some embodiments, each field of the compressed data structure can be a separate data structure. The operations 100 can be executed, for example, by a source computing system to compress a binary executable generated for execution on a target computing system. A binary executable can be generated for execution on a target computing system when, inter alia, the binary executable is compiled for an instruction set supported by the target computing system. In some embodiments, the source computing system and the target computing system are the same computing system. In certain embodiments, the operations 100 can be executed by components on or more computing system. For example, the operations can be executed by a processor 606 of the computing device 600 (FIG. 6).

A source computing system executing the operations 100 can begin by executing operation 105 to generate a dictionary (e.g., a table) of the most frequently occurring values of blocks (e.g., data objects) in the data structure. In some embodiments, the dictionary can be generated by executing a first pass, or scan, through the entire data structure and generating a histogram of the stored block values. Each bin in the histogram can correspond to a unique block value in the data structure, while the frequency of a bin is a count of the number of times a given block value occurs in the data structure. A threshold number of block values with the highest frequencies can be selected, or used, to generate the dictionary (e.g., the block values can be stored as entries in the dictionary). In some embodiments, for example, the 256 most frequently occurring block values in a data structure can be used to generate a dictionary. A selected block value is stored at an index in the dictionary. In some embodiments the index of a block value is position in the dictionary relative the beginning of the dictionary. A block value stored in a dictionary having 256 values, for example, can have an index between zero and 255.

In some embodiments, a data width of a block value stored in the dictionary (e.g., the block size or the number of bytes or bits used to represent a block value) is determined by an architecture (e.g., the instruction set) of the target computing system.

The source computing system can execute operation 110 to select (e.g., read) an uncompressed block from the input data structure. The uncompressed block can be selected by sequentially parsing the input data structure and selecting the next unprocessed block. In certain embodiments, an index of the selected block is determined.

The source computing system can execute operation 115 to determine whether the selected unprocessed block has a match in the dictionary (e.g., determine whether a value of block has a matching value store in the dictionary). Known search algorithms can be used to find a match in the dictionary.

The source computing system can execute operation 120 in response to determining that the unprocessed block does not have a match in the dictionary. Executing operation 120 can include storing the unprocessed block (e.g., the value of the unprocessed block) in the compressed data field (e.g., a first data structure) of the compressed data structure. The unprocessed block can be stored as an uncompressed symbol in the compressed data field at a location (e.g., a position or index) corresponding to the position of the unprocessed block in the input data structure.

The source computing system can execute operation 125 in response to determining that the unprocessed block does have a match in the dictionary. Executing operation 125 can include determining an index of the match in the dictionary (e.g., a table index or the position of the match in the dictionary). The index can then be stored as a compressed symbol in the data field of the compressed data structure. In some embodiments, the index can be stored in the data field at a location or index corresponding to the position of the unprocessed in the input data structure.

The source computing system can execute operation 130 to store, in the header field of the compressed data structure, a value (e.g., a compression indicator) indicating whether the stored symbol was compressed or uncompressed. In some embodiments, the stored value is a single bit. For example, a bit value of zero can be stored in the header field in response to executing operation 120, while a bit value of one can be stored in the header field in response to executing operation 125. In certain embodiments, the value can be stored in the head field at a location corresponding the position of the uncompressed data object in the input data set or a position of the system in the compressed data field.

The source computing system can execute operation 135 to determine whether there are more unprocessed blocks in the input data structure. The source computing system can continue to operation 110 in response to determining that there are more unprocessed blocks, while the source computing system can proceed to operation 140 in response to determining that there are no remaining unprocessed data objects.

In some embodiments where the fields of the compressed data structure are separate data structures, the source computing system can execute operation 140 to merge, or otherwise, the separate data structures to generate a single compressed data structure.

Figure 2:
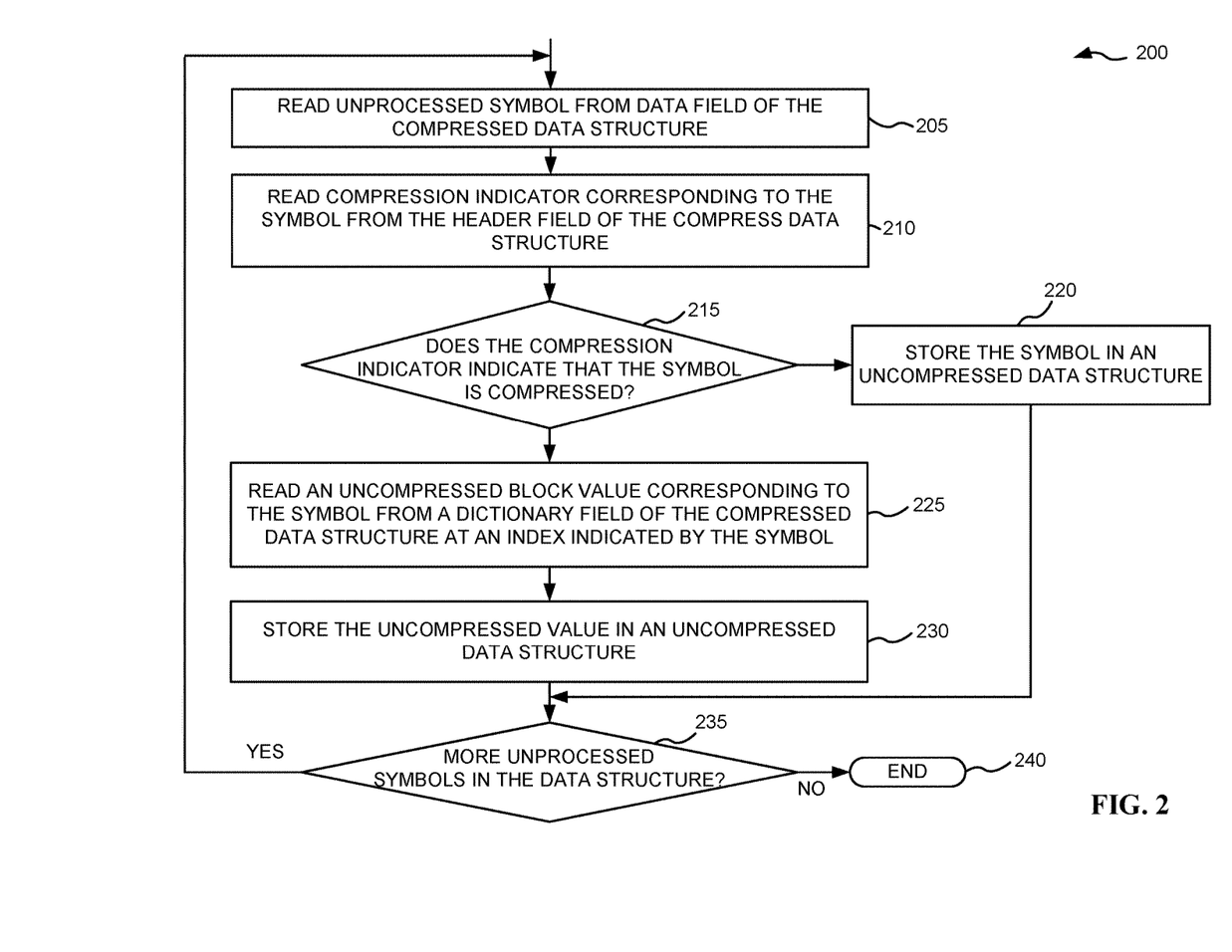
FIG. 2 depicts a flowchart of a set of operations for decompressing a compressed data structure generated for a computing system, according to various embodiments.

FIG. 2 depicts a flowchart of a set of operations 200 for decompressing a compressed data structure generated for a computing system, according to various embodiments. The compressed data structure can be generated by a source computing system for a target computing system according to the operations 100, shown in FIG. 1. Accordingly, the operations 200 can be executed by a target computing system to, for example, decompress a compressed binary executable for execution by the target computing system. In some embodiments, the source computing system that generated the compressed data structure and the target computing system can be the same computing system. The operations 200 can be executed by a processor 606 of the computing device 600 (FIG. 6). In some embodiments, computer executable code (e.g., decompression firmware and software) for executing the operations 200 can included in, or associated with, the compressed data structure. In particular embodiments, the target computing system includes a computing environment having limited memory or storage for storing and operating on (e.g., decompressing and executing) the compressed data structure.

The target computing system can execute operation 205 to read an unprocessed symbol from the compressed data field of the compressed data structure. The unprocessed symbol can be read by sequentially parsing the compressed data field and selecting the next unprocessed symbol in the sequence. In certain embodiments, an index of the unprocessed symbol is determined.

The target computing system can execute operation 210 to read the header field of the compressed data structure to retrieve a compression indicator associated with the unprocessed symbol. In some embodiments, the compression indicator associated with the unprocessed symbol is a bit at a position in the header field indicated by the index of the unprocessed symbol.

The target computing system can execute operation 215 to determine whether the unprocessed symbol is compressed or uncompressed. The target computing system can continue to operation 220 when the unprocessed symbol is not compressed, while the target computing system can proceed to operation 225 when the unprocessed data symbol is compressed.

The target computing system can execute operation 220 to store the unprocessed symbol in an uncompressed data structure. The unprocessed symbol can be stored as a block in the uncompressed data structure at a location corresponding to the index of the unprocessed symbol in the compressed data structure. The uncompressed data structure can be a binary executable, as described herein.

The target computing system can execute operation 225 to read an uncompressed block value corresponding to the unprocessed symbol from the dictionary filed of the compressed data structure. In certain embodiments, the unprocessed symbol (e.g., the value of the unprocessed symbol) is used an index into the dictionary to retrieve the corresponding block value.

The target computing system can execute operation 230 to store the uncompressed block value corresponding to the unprocessed symbol in the uncompressed data structure. The uncompressed block value can be store in the uncompressed data structure at a location corresponding to the index of the unprocessed symbol in the compressed data structure.

The target computing system can execute operation 235 to determine whether there are more unprocessed symbols in the compressed data structure. The target computing system can continue to operation 205 in response to determining that there are more unprocessed symbols, while the target computing system can end execution of the operations 200 at operation 240 in response to determining that there are no remaining unprocessed symbols.

In some embodiments, the operations 200 can be executed concurrently by two or more processors or threads of the target computing system.

Figure 3:
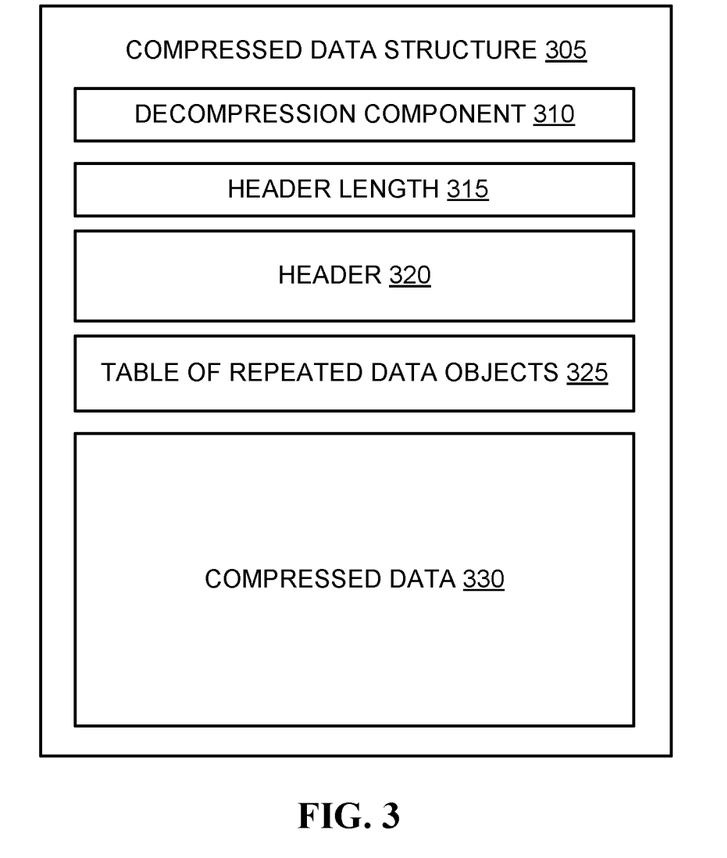
FIG. 3 depicts a block diagram of a compressed data structure, according to various embodiments.

FIG. 3 depicts a block diagram of a compressed data structure 305, according to various embodiments. The compressed data structure 305 includes header length field 315, header field 320, table of repeated objects field 325, and a compressed data field 330. Header length field 315 can indicate the length in, for example bits, of the header field 320. The header field 320 can include compression indicators for determining, or indicating, whether a symbol in compressed data 330 is compressed or uncompressed. The table of repeated data objects 325 be a dictionary, having a predetermined number of the most repeated block values in an uncompressed data set. Compressed data 330 can include an array of compressed and uncompressed symbols, as described herein.

In some embodiments, the compressed data structure 305 includes decompression code component 310. Decompression component 310 can include uncompressed executable code, having a small fixed memory foot print, for decompressing the compressed data structure 305 according to the operations 200 (FIG. 2). In certain embodiments, the decompression component 310 can stored in a separate data structure.

Figure 4:
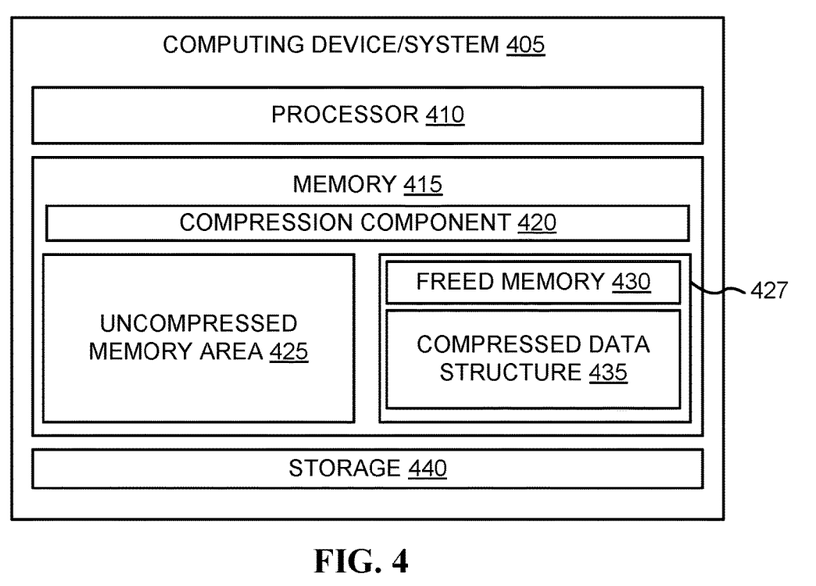
FIG. 4 depicts a block diagram of an example system for compressing and decompressing a data structure, according to various embodiments.

FIG. 4 depicts a block diagram of an example system 405 for compressing and decompressing a data structure, according to various embodiments. The system 405 can be a source computing and a target computing system configured to, respectively, execute the operations 100 (FIG. 1) and the operations 200 (FIG. 2). In certain embodiments, the computing system 405 can be a computing device such as the computing device 600. In other embodiments, the computing system 405 is an embedded component of a source computing system or target computing system.

The computing system 405 can include a processor 410, a memory 415, and a storage 440. The processor 410 can be an electronic circuit configured to execute computer executable code to perform the operations described herein. The memory 415 can be electronic circuits configured to store data objects. The memory 415 can be any non-transitory volatile or nonvolatile computer memory. The storage 440 be included in the computing system 405 for additional or longer term storage capacity.

The memory 415 can include compression component 420, uncompressed memory area 425 and compressed memory area 427. Compression component 420 can include code executable by the processor 410 to compress an uncompressed data structure, as described herein. In some embodiments, compression component 420 can include decompression code executable by the processor 410 to decompress a compressed data structure, as described herein. Uncompressed memory area 425 can store an uncompressed data structure, as described herein. Compressed memory area 427 can store a compressed data structure, as described herein. In some embodiments, uncompressed memory area 425 and compressed memory area 427 can be the same memory area, wherein compressed memory 427 replaces uncompressed memory area 425 after compression component 420 compresses a data structure stored in the uncompressed memory area.

Compressed memory area 427 can include freed memory 430 and compressed data structure 435. Freed memory 430 can be a portion of the uncompressed memory area 425 freed, or otherwise made available, when a data structure stored in the uncompressed memory area is compressed to generate compressed data structure 435. The compressed data structure 435 can be a version of the compressed data structure 305 (FIG. 3).

Figure 5:
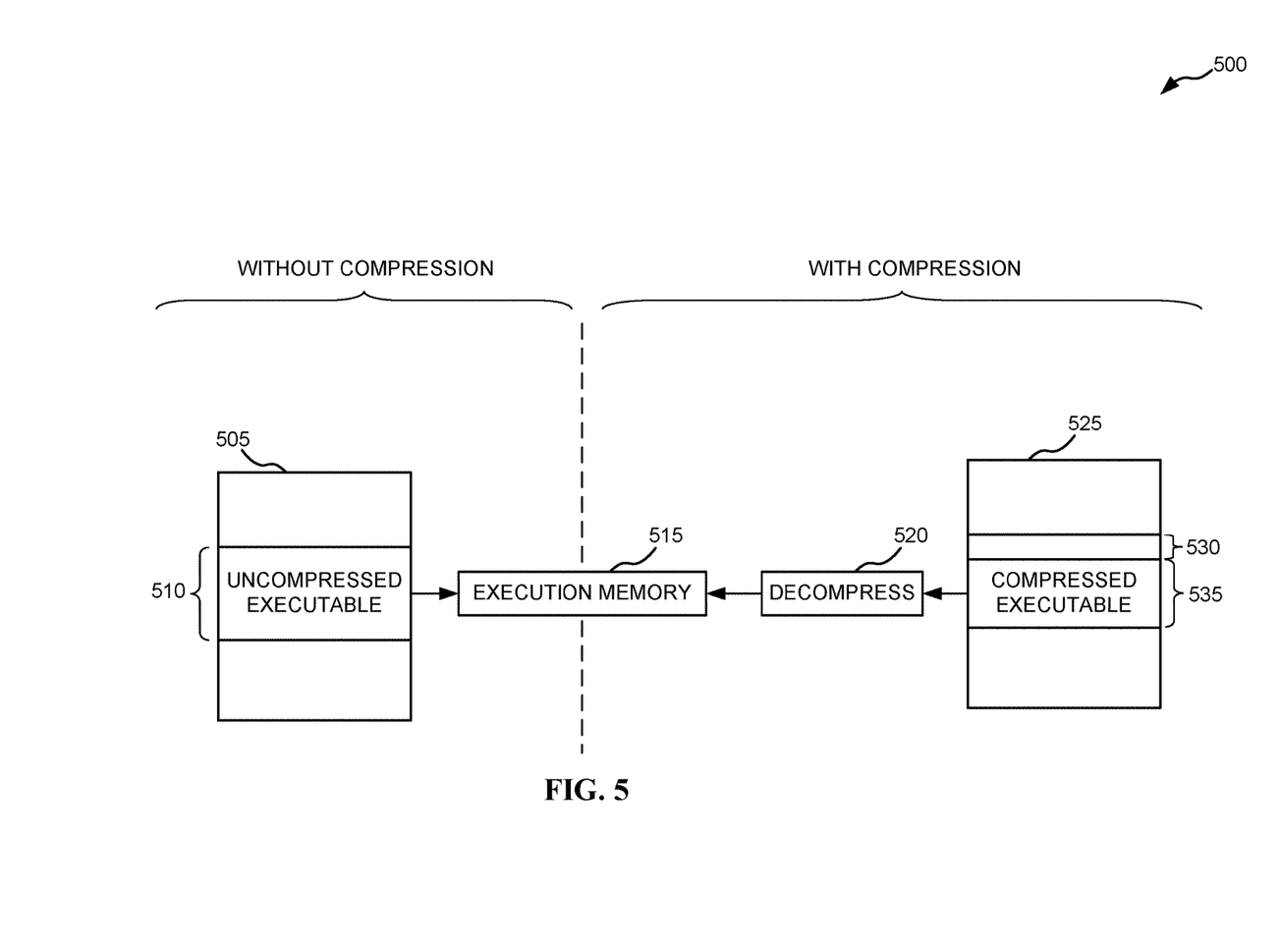
FIG. 5 depicts a diagram of an example implementation of a system for compressing and decompressing a data structure, according to various embodiments.

FIG. 5 depicts a diagram of an example implementation of a system for compressing and decompressing a data structure on a particular computing system, according to various embodiments. Without compression, the program memory 505 (e.g., a nonvolatile memory) includes uncompressed binary executable 510 having a code size of 89 Kilobytes (KB). Execution memory 515 has storage size of 96 KB. Considering other applications using execution memory 515 (e.g., a loader) and dynamic and static memory allocation during execution of applications one the particular computing system, the large size of the uncompressed binary executable 510 prevents it from being loaded into execution memory 515 and executed. The uncompressed binary executable 510 can be compressed according to the techniques described herein to generate compressed executable 535, freeing program memory 530. On the particular computing system, the uncompressed binary executable is compressed to approximately 64 KB, freeing up 25 KB of program memory. Using a small decompression algorithm (e.g., code size less than 500 bytes) enabled by the techniques described herein, the compressed executable can be loaded into execution memory 515 and decompressed 520 and executed on the fly.

FIG. 6 depicts a block diagram of a computing system configured to execute a set of operations for compressing and decompressing a data structure, according to various embodiments. The components of the computing device 600 can include one or more processors 606, a memory 612, a terminal interface 618, a storage interface 620, an Input/Output ("I/O") device interface 622, and a network interface 624, all of which are communicatively coupled, directly or indirectly, for inter-component communication via a memory bus 610, an I/O bus 616, bus interface unit ("IF") 608, and an I/O bus interface unit 614.

The computing device 600 may include one or more general-purpose programmable central processing units (CPUs) 606A and 606B, herein generically referred to as the processor 606. In an embodiment, the computing device 600 may contain multiple processors; however, in another embodiment, the computing device 600 may alternatively be a single CPU device. Each processor 606 executes instructions stored in the memory 612.

The computing device 600 may include a bus interface unit 608 to handle communications among the processor 606, the memory 612, the display system 604, and the I/O bus interface unit 614. The I/O bus interface unit 614 may be coupled with the I/O bus 616 for transferring data to and from the various I/O units. The I/O bus interface unit 114 may communicate with multiple I/O interface units 618, 620, 622, and 624, which are also known as I/O processors (IOPs) or I/O adapters (IOAs), through the I/O bus 616. The display system 604 may include a display controller, a display memory, or both. The display controller may provide video, audio, or both types of data to a display device 602. The display memory may be a dedicated memory for buffering video data. The display system 104 may be coupled with a display device 602, such as a standalone display screen, computer monitor, television, a tablet or handheld device display, or another other displayable device. In an embodiment, the display device 102 may include one or more speakers for rendering audio. Alternatively, one or more speakers for rendering audio may be coupled with an I/O interface unit. In alternate embodiments, one or more functions provided by the display system 604 may be on board an integrated circuit that also includes the processor 606. In addition, one or more of the functions provided by the bus interface unit 608 may be on board an integrated circuit that also includes the processor 606.

The I/O interface units support communication with a variety of storage and I/O devices. For example, the terminal interface unit 618 supports the attachment of one or more user I/O devices, which may include user output devices (such as a video display devices, speaker, and/or television set) and user input devices (such as a keyboard, mouse, keypad, touchpad, trackball, buttons, light pen, or other pointing devices). A user may manipulate the user input devices using a user interface, in order to provide input data and commands to the user I/O device 626 and the computing device 600, may receive output data via the user output devices. For example, a user interface may be presented via the user I/O device 626, such as displayed on a display device, played via a speaker, or printed via a printer.

The storage interface 620 supports the attachment of one or more disk drives or direct access storage devices 628 (which are typically rotating magnetic disk drive storage devices, although they could alternatively be other storage devices, including arrays of disk drives configured to appear as a single large storage device to a host computer, or solid-state drives, such as a flash memory). In another embodiment, the storage device 628 may be implemented via any type of secondary storage device. The contents of the memory 612, or any portion thereof, may be stored to and retrieved from the storage device 628 as needed. The I/O device interface 622 provides an interface to any of various other I/O devices or devices of other types, such as printers or fax machines. The network interface 624 provides one or more communication paths from the computing device 600 to other digital devices and computer systems.

Although the computing device 600 shown in FIG. 6 illustrates a particular bus structure providing a direct communication path among the processors 606, the memory 612, the bus interface 608, the display system 604, and the I/O bus interface unit 614, in alternative embodiments the computing device 600 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 614 and the I/O bus 608 are shown as single respective units, the computing device 600, may include multiple I/O bus interface units 614 and/or multiple I/O buses 616. While multiple I/O interface units are shown, which separate the I/O bus 616 from various communication paths running to the various I/O devices, in other embodiments, some or all of the I/O devices are connected directly to one or more system I/O buses.

In various embodiments, the computing device 600 is a multi-user mainframe computer system, a single-user system, or a server computer or similar device that has little or no direct user interface, but receives requests from other computer systems (clients). In other embodiments, the computing device 600 may be implemented as a desktop computer, portable computer, laptop or notebook computer, tablet computer, pocket computer, telephone, smart phone, or any other suitable type of electronic device.

In an embodiment, the memory 612 may include a random-access semiconductor memory, storage device, or storage medium (either volatile or non-volatile) for storing or encoding data and programs. In another embodiment, the memory 612 represents the entire virtual memory of the computing device 600, and may also include the virtual memory of other computer systems coupled to the computing device 600 or connected via a network 630. The memory 612 may be a single monolithic entity, but in other embodiments the memory 612 may include a hierarchy of caches and other memory devices. For example, memory may exist in multiple levels of caches, and these caches may be further divided by function, so that one cache holds instructions while another holds non-instruction data, which is used by the processor. Memory 612 may be further distributed and associated with different CPUs or sets of CPUs, as is known in any various so-called non-uniform memory access (NUMA) computer architectures.

The memory 612 may store all or a portion of the components and data shown in FIG. 1-4. These programs and data structures are illustrated in FIG. 1-4 as being included within the memory 612 in the computing device 600; however, in other embodiments, some or all of them may be on different computer systems and may be accessed remotely, e.g., via a network 630. The computing device 600 may use virtual addressing mechanisms that allow the programs of the computing device 600 to behave as if they only have access to a large, single storage entity instead of access to multiple, smaller storage entities. Thus, while the components and data shown in FIG. 1-4 are illustrated as being included within the memory 612, these components and data are not necessarily all completely contained in the same storage device at the same time. Although the components and data shown in FIG. 1-4 are illustrated as being separate entities, in other embodiments some of them, portions of some of them, or all of them may be packaged together.

In an embodiment, the components and data shown in FIG. 1-4 may include instructions or statements that execute on the processor 606 or instructions or statements that are interpreted by instructions or statements that execute the processor 606 to carry out the functions as further described below. In another embodiment, the components shown in FIG. 1-4 may be implemented in hardware via semiconductor devices, chips, logical gates, circuits, circuit cards, and/or other physical hardware devices in lieu of, or in addition to, a processor-based system. In an embodiment, the components shown in FIG. 1-4 may include data in addition to instructions or statements.

FIG. 6 is intended to depict representative components of the computing device 600. Individual components, however, may have greater complexity than represented in FIG. 6. In FIG. 6, components other than or in addition to those shown may be present, and the number, type, and configuration of such components may vary. Several particular examples of additional complexity or additional variations are disclosed herein; these are by way of example only and are not necessarily the only such variations. The various program components illustrated in FIG. 6 may be implemented, in various embodiments, in a number of different ways, including using various computer applications, routines, components, programs, objects, modules, data structures etc., which may be referred to herein as "software," "computer programs," or simply "programs."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for compressing a data structure generated for a computing system, the method comprising:
   generating a table comprising block values of a set of blocks in the data structure, wherein:
      a block size of each block in the set of blocks is determined by an architecture of the computing system, and
      the block values are a threshold number of the most frequently occurring block values in the data structure;
   determining whether a first block value of a block in the data structure is stored in the table, the block occurring at a position in the data structure;
   storing, in response to determining that the first block value is stored in the table, a table index of the first block value at a first location in a first data structure, the first location corresponding to the position;
   storing, at a second location in a second data structure, a second value indicating whether the first block value is stored in the table, the second location corresponding to the position; and
   generating a compressed data structure, the compressed data structure comprising the table, first data structure and the second data structure.

2. The method of claim 1, further comprising:
   storing, in response to determining that the first block value is not stored in the table, the first value at the first location in the first data structure.

3. The method of claim 1, wherein a data width of table indexes into the table is smaller than the block size of each block in the set of blocks.

4. The method of claim 1, wherein a data width of table indexes into the table is one byte.

5. The method of claim 1, wherein the second value is a bit.

6. The method of claim 1, wherein the block size of each block in the set of blocks is determined by the width of the instruction set of the computing system.

7. The method of claim 1, wherein the second data structure is the first data structure.

8. The method of claim 1, wherein the data structure is a binary executable file of the computing system.

9. A system for compressing a data structure generated for a computing system, this system comprising:
   one or more computing nodes having a memory and a processor; and a non-transitory computer readable storage medium of the one or more computing nodes having program instructions embodied therewith, the program instructions executable by the processor to cause the system to:
- generate a table comprising block values of a set of blocks in the data structure, wherein:
  - a block size of each block in the set of blocks is determined by an architecture of the computing system, and
  - the block values are a threshold number of the most frequently occurring block values in the data structure;
- determine whether a first block value of a block in the data structure is stored in the table, the block occurring at a position in the data structure;
- store, in response to determining that the first block value is stored in the table, a table index of the first block value at a first location in a first data structure, the first location corresponding to the position;
- store, at a second location in a second data structure, a second value indicating whether the first block value is stored in the table, the second location corresponding to the position; and
- generate a compressed data structure, the compressed data structure comprising the table, the first data structure, and the second data structure.

10. The system of claim 9, wherein the program instructions are further executable by the processor to cause the system to:
- store, in response to determining that the first block value is not stored in the table, the first value at the first location in the first data structure.

11. The system of claim 9, wherein a data width of table indexes into the table is smaller than the block size of each block in the set of blocks.

12. The system of claim 9, wherein a data width of table indexes into the table is one byte.

13. The system of claim 9, wherein the second value is a bit.

14. The system of claim 9, wherein the data set is a binary executable file of the computing system.

15. A computer program product for compressing a data structure generated for a computing system, the computer program product including a computer readable storage medium having program instructions embodied therewith, wherein the computer readable storage medium is not a transitory signal per se, the program instructions executable by a processing circuit to cause the processing circuit to perform a method comprising:
- generating a table comprising block values of a set of blocks in the data structure, wherein:
  - a block size of each block in the set of blocks is determined by an architecture of the computing system, and
  - the block values are a threshold number of the most frequently occurring block values in the data structure;
- determining whether a first block value of a block in the data structure is stored in the table, the block occurring at a position in the data structure;
- storing, in response to determining that the first block value is stored in the table, a table index of the first block value at a first location in a first data structure, the first location corresponding to the position;
- storing, at a second location in a second data structure, a second value indicating whether the first block value is stored in the table, the second location corresponding to the position; and generating a compressed data structure, the compressed data structure comprising the table, first data structure and the second data structure; and
- generating a compressed data structure, the compressed data structure comprising the table, the first data structure, and the second data structure.

16. The computer program product of claim 15, wherein the method further comprises:
- storing, in response to determining that the first block value is not stored in the table, the first value at the first location in the first data structure.

17. The computer program product of claim 15, wherein a data width of table indexes into the table is smaller than the block size of each block in the set of blocks.

18. The computer program product of claim 15, wherein a data width of table indexes into the table is one byte.

19. The computer program product of claim 15, wherein the second value is a bit.

20. The computer program product of claim 15, wherein the block size of each block in the set of blocks is determined by the width of the instruction set of the computing system.

* * * * *